(12) United States Patent
Paleczny et al.

(10) Patent No.: US 8,446,076 B2
(45) Date of Patent: May 21, 2013

(54) PIEZOELECTRIC ASSEMBLY

(75) Inventors: Todd Robert Paleczny, Heidelberg (CA); Risto Tuomas Kontio, Waterloo (CA); Arnett Weber, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 451 days.

(21) Appl. No.: 12/820,275

(22) Filed: Jun. 22, 2010

(65) Prior Publication Data
US 2010/0328242 A1 Dec. 30, 2010

Related U.S. Application Data

(60) Provisional application No. 61/219,969, filed on Jun. 24, 2009.

(51) Int. Cl.
*H01L 41/09* (2006.01)
(52) U.S. Cl.
USPC .......................... 310/365; 310/328
(58) Field of Classification Search
USPC .................... 310/328, 365, 366
See application file for complete search history.

(56) References Cited

U.S. PATENT DOCUMENTS

| | | | | |
|---|---|---|---|---|
| 2,329,497 A | * | 9/1943 | Washburn | 310/356 |
| 2,388,242 A | * | 11/1945 | Arndt, Jr. | 310/331 |
| 7,324,094 B2 | | 1/2008 | Moilanen | |
| 2001/0004125 A1 | * | 6/2001 | Schulthess et al. | 257/416 |
| 2003/0227559 A1 | | 12/2003 | Rouvinen et al. | |
| 2006/0081071 A1 | * | 4/2006 | Kessler et al. | 73/862.391 |
| 2007/0236450 A1 | * | 10/2007 | Colgate et al. | 345/156 |
| 2008/0199332 A1 | | 8/2008 | Satoh et al. | |
| 2008/0239024 A1 | | 10/2008 | Sugahara | |

FOREIGN PATENT DOCUMENTS

| | | |
|---|---|---|
| EP | 1708357 | 10/2006 |
| EP | 1 770 798 | 4/2007 |
| JP | 53-90793 | * 8/1978 |
| JP | 1-283069 | * 11/1989 |
| JP | 2-246385 | * 10/1990 |
| JP | 2006-253350 | * 9/2006 |
| WO | WO 03038800 | 5/2003 |
| WO | WO 2006054812 | 5/2005 |
| WO | WO 2006041513 | 4/2006 |

OTHER PUBLICATIONS

Pui Audio: Using a Piezo Bender as a Switch, http://www.projectsunlimited.com/audioProducts/MovieClips/TechNotes/Glossary.asp?articalID=32, Nov. 21, 2006.

(Continued)

*Primary Examiner* — Thomas Dougherty
(74) *Attorney, Agent, or Firm* — Ridout & Maybee LLP

(57) ABSTRACT

A piezoelectric assembly and portable electronic device having a piezoelectric assembly are described. The piezoelectric assembly comprises a first electrode for electrical communication to a current or voltage source, a second electrode for electrical communication to a reference source, a piezoelectric material in electrical communication with each one of the first and second electrodes and between the first and second electrodes, a signal electrical connector in electrical communication with the first electrode and configured to be connected to the current or voltage source, and a reference electrical connector in electrical communication with the second electrode and configured to be connected to the reference source so as to provide electrical communication between the second electrode and the reference source.

21 Claims, 10 Drawing Sheets

OTHER PUBLICATIONS

Ultrasonics, 48:Apr. 2, 2008, p. 91-97: Fabrication and characteristics of thin disc piezoelectric transformers based on piezoelectric buzzers with gap circle.

Luk et al. "A Role for Haptics in Mobile Interaction: Initial Design Using a Handheld Tactile Display Prototype", CHI 2006, Proceedings of SIGCHI Conference on Human Factors in Computing Systems, ACM, Apr. 28, 2006, http://www.cs.ubc.ca/view/docs/Luk-CHI06.pdf.

Office Action; Canadian Application No. 2,708,020; Dec. 10, 2012.

* cited by examiner

PIEZOELECTRIC ASSEMBLY

RELATED APPLICATION DATA

The present application claims priority to, and the benefit of, provisional U.S. patent application Ser. No. 61/219,969, filed Jun. 24, 2009, which is incorporated herein by reference in its entirety.

TECHNICAL FIELD

The present disclosure relates generally to piezoelectric assemblies. In particular, the present disclosure relates to piezoelectric assemblies suitable for electronic devices including devices having a touch-sensitive display.

BACKGROUND

Electronic devices, including portable electronic devices, have gained widespread use and can provide a variety of functions including, for example, telephonic, electronic messaging and other personal information manager (PIM) application functions. Portable electronic devices can include several types of devices including mobile stations such as simple cellular telephones, smart telephones, wireless PDAs, and laptop computers with wireless 802.11 or Bluetooth capabilities. These devices run on a wide variety of networks from data-only networks such as Mobitex and DataTAC to complex voice and data networks such as GSM/GPRS, CDMA, EDGE, UMTS and CDMA2000 networks.

Such devices often employ a touch-sensitive display. A tactile mechanism is typically incorporated into the touch-sensitive display to provide a tactile feedback when a user interacts with the touch-sensitive display. For example, there may be mechanical switch incorporated into the touch-sensitive display to mimic the feel of a physical keyboard. Other mechanisms may use a piezoelectric assembly that provides tactile feedback. However, such piezoelectric assemblies may crack, for example due to mechanical stress, and the associated loss of electrical connectivity in portions of the piezoelectric assembly may result in an unfavourable tactile feedback.

BRIEF DESCRIPTION OF THE DRAWINGS

Embodiments of the present disclosure will now be described, by way of example only, with reference to the attached Figures, wherein.

DETAILED DESCRIPTION OF EXAMPLE EMBODIMENTS

Figure 1:
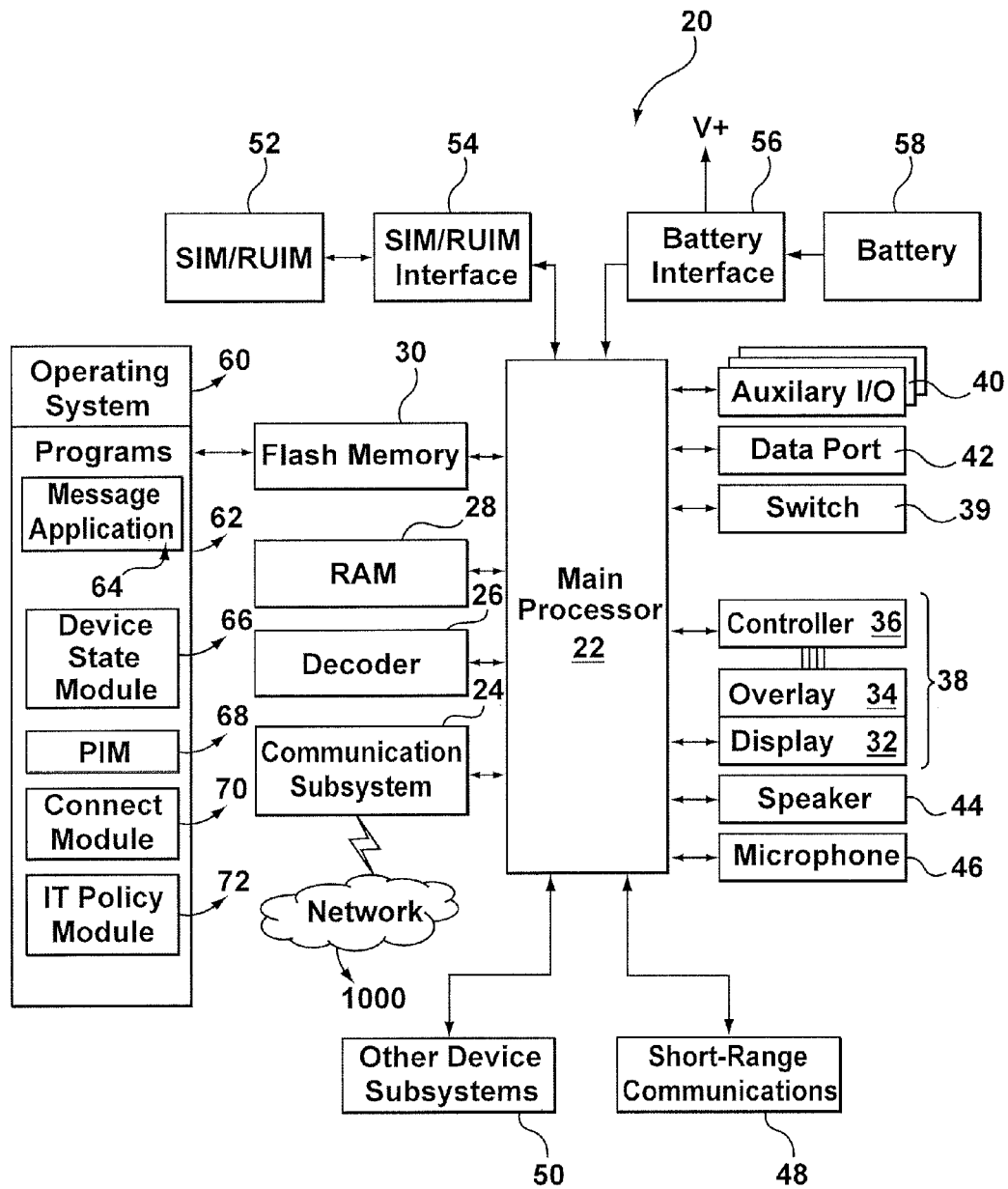
FIG. 1 is a block diagram of a portable electronic device according to an example.

It will be appreciated that for simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. A person skilled in the art would understand variations and modifications, both those currently known and those that may be later developed, are possible within the scope of the disclosure. Also, the description is not to be considered as limiting the scope of the embodiments described herein.

The embodiments described herein generally relate to an electronic device including a touch-sensitive display. Such electronic devices may in particular be portable electronic devices, including communication devices. Examples of portable electronic devices include mobile, or handheld, wireless communication devices such as pagers, cellular phones, cellular smart-phones, wireless organizers, personal digital assistants, wirelessly enabled notebook computers and the like.

The present disclosure provides a piezoelectric assembly which comprises a source electrical connector for connecting a current source to a first electrode, and a reference electrical connector for connecting a reference source to a second electrode. The source electrical connector is configured to provide increased contact and electrical communication with the first electrode even when a crack develops and extends through the first electrode. The source electrical connector and/or reference electrical connector may be a hoop-type electrical connector which increases the surface area for connecting the first electrode to the piezoelectric element compared with a single point-type contact laser soldered or induction soldered to the electrode. This provides redundancy in the event that the first electrode or the piezoelectric element cracks. If the piezoelectric element cracks, for example, due to mechanical shock, it should still behave both mechanically and electrically similar to a non-cracked piezoelectric element. This may also prevent electrical arcing across the surface of a cracked electrode. The signal electrical connector may include a number of extensions extending radially inwardly from the hoop shaped contact portion to further increase the contact surface area. Furthermore, the source electrical connector and reference electrical connector may be a flexible PCB which eliminates solder a possible stress is removed.

In accordance with one embodiment of the present disclosure, there is provided a piezoelectric assembly and portable electronic device having a piezoelectric assembly are described. The piezoelectric assembly comprises a first electrode for electrical communication to a current or voltage source, a second electrode for electrical communication to a reference source, a piezoelectric material in electrical communication with each one of the first and second electrodes and between the first and second electrodes, a signal electrical connector in electrical communication with the first electrode and configured to be connected to the current or voltage source, and a reference electrical connector in electrical communication with the second electrode and configured to be connected to the reference source so as to provide electrical communication between the second electrode and the reference source. The electrical connectors are configured to provide improved contact with the current or voltage source, reference source, or both.

In accordance with another embodiment of the present disclosure, there is provided a piezoelectric assembly, comprising: a first electrode for electrical communication to a current or voltage source, the first electrode having a contact surface; a second electrode for electrical communication to a reference source, the second electrode being spaced apart from the first electrode such that an electric field is generated between the first and second electrodes when an electrical signal is received at the first electrode from the current or voltage source; a piezoelectric material in electrical communication with each one of the first and second electrodes and between the first and second electrodes, the piezoelectric material being disposed in the generated electric field when the first electrode receives the electrical signal, wherein the piezoelectric material has an unactuated state and an actuated state, wherein the piezoelectric material is disposed in the unactuated state in the absence of the generated electric field, and wherein the piezoelectric material becomes displaced and disposed in the actuated state in the presence of the generated electric field; a signal electrical connector in electrical communication with the first electrode and configured to be connected to the current or voltage source so as to provide electrical communication between the first electrode and the current or voltage source, the signal electrical connector has a contact portion having a relatively large surface area or forms multiple points of contact with the contact surface of the first electrode; and a reference electrical connector in electrical communication with the second electrode and configured to be connected to the reference source so as to provide electrical communication between the second electrode and the reference source.

In accordance with a further embodiment of the present disclosure, there is provided a piezoelectric assembly, comprising: a first electrode for electrical communication to a current or voltage source; a second electrode for electrical communication to a reference source, the second electrode being spaced apart from the first electrode such that an electric field is generated between the first and second electrodes when an electrical signal is received at the first electrode from the current or voltage source; a piezoelectric material in electrical communication with each one of the first and second electrodes and between the first and second electrodes, the piezoelectric material being disposed in the generated electric field when the first electrode receives the electrical signal, wherein the piezoelectric material has an unactuated state and an actuated state, wherein the piezoelectric material is disposed in the unactuated state in the absence of the generated electric field, and wherein the piezoelectric material becomes displaced and disposed in the actuated state in the presence of the generated electric field; a signal electrical connector in electrical communication with the first electrode and configured to be connected to the current or voltage source so as to provide electrical communication between the first electrode and the current or voltage source; and a reference electrical connector in electrical communication with the second electrode and configured to be connected to the reference source so as to provide electrical communication between the second electrode and the reference source, wherein the second electrode is disc-shaped and the contact portion of the reference electrical connector is hoop shaped forming a hoop shaped contact portion.

In accordance with yet a further embodiment of the present disclosure, there is provided a handheld electronic device, comprising: a processor; a touch-sensitive display connected to the microprocessor for accepting touch input; a piezoelectric assembly as described herein connected to the touch-sensitive display for providing a tactile feedback in response to the touch input, the piezoelectric assembly being disposed adjacent to a surface of the touch-sensitive display opposing an interface surface, the piezoelectric assembly being in a first configuration away from the touch-sensitive display in an unactuated state and being disposed in a second configuration with the touch-sensitive display in an actuated state, the piezoelectric assembly being actuated in response to a signal representing an initial touch input and being unactuated in the absence of the signal representing the initial touch input.

The portable electronic device may be a two-way communication device with advanced data communication capabilities including the capability to communicate with other portable electronic devices or computer systems through a network of transceiver stations. The portable electronic device may also have the capability to allow voice communication. Depending on the functionality provided by the portable electronic device, it may be referred to as a data messaging device, a two-way pager, a cellular telephone with data messaging capabilities, a wireless Internet appliance, or a data communication device (with or without telephony capabilities). The portable electronic device may also be a portable device without wireless communication capabilities as a handheld electronic game device, digital photograph album, digital camera and the like.

Referring first to FIG. 1, there is shown therein a block diagram of an example embodiment of a portable electronic device 20 which includes a number of components such as a main processor 22 that controls the overall operation of the portable electronic device 20. Communication functions, including data and voice communications, are performed through a communication subsystem 24. Data received by the portable electronic device 20 can be decompressed and decrypted by a decoder 26, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). The communication subsystem 24 may receive messages from and send messages to a wireless network 1000. In this example embodiment of the portable electronic device 20, the communication subsystem 24 may be configured in accordance with the Global System for Mobile Communication (GSM) and General Packet Radio Services (GPRS) standards. The GSM/GPRS wireless network is used worldwide. New standards such as Enhanced Data GSM Environment (EDGE) and Universal Mobile Telecommunications Service (UMTS) are believed to have similarities to the network behavior described herein, and it will also be understood by persons skilled in the art that the embodiments described herein may use any other suitable standards that are developed in the future. The wireless link connecting the communication subsystem 24 with the wireless network 1000 may represent one or more different Radio Frequency (RF) channels, operating according to defined protocols specified for GSM/GPRS communications. With newer network protocols, these channels may be capable of supporting both circuit switched voice communications and packet switched data communications.

Although the wireless network 1000 associated with the portable electronic device 20 may be a GSM/GPRS wireless network in one example implementation, other wireless networks may also be associated with the portable electronic device 20 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The main processor 22 may also interact with additional subsystems such as a Random Access Memory (RAM) 28, a flash memory 30, a display 32 with a touch-sensitive overlay 34 connected to an electronic controller 36 that together make up a touch-sensitive display 38, a tactile mechanism 39, an auxiliary input/output (I/O) subsystem 40, a data port 42, a speaker 44, a microphone 46, short-range communications 48 and other device subsystems 50. The touch-sensitive overlay 34 and the electronic controller 36 provide a touch-sensitive input device and the main processor 22 may interact with the touch-sensitive overlay 34 via the electronic controller 36.

Some of the subsystems of the portable electronic device 20 may perform communication-related functions, whereas other subsystems may provide "resident" or on-device functions. By way of example, the display 32 and the touch-sensitive overlay 34 may be used for both communication-related functions, such as entering a text message for transmission over the network 1000, and device-resident functions such as a calculator or task list.

The portable electronic device 20 can send and receive communication signals over the wireless network 1000 after network registration or activation procedures have been completed. Network access may be associated with a subscriber or user of the portable electronic device 20. To identify a subscriber according to the present embodiment, the portable electronic device 20 may use a SIM/RUIM card 52 (i.e. Subscriber Identity Module or a Removable User Identity Module) inserted into a SIM/RUIM interface 54 for communication with a network such as the network 1000. The SIM/RUIM card 52 is one type of a conventional "smart card" that can be used to identify a subscriber of the portable electronic device 20 and to personalize the portable electronic device 20, among other things. In an embodiment the portable electronic device 20 may not be fully operational for communication with the wireless network 1000 without the SIM/RUIM card 52. By inserting the SIM/RUIM card 52 into the SIM/RUIM interface 54, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM/RUIM card 52 may include a processor and memory for storing information. Once the SIM/RUIM card 52 is inserted into the SIM/RUIM interface 54, it may be connected to the processor 22. In order to identify the subscriber, the SIM/RUIM card 52 can include some user parameters such as an International Mobile Subscriber Identity (IMSI). An advantage of using the SIM/RUIM card 52 is that a subscriber is not necessarily bound by any single physical portable electronic device. The SIM/RUIM card 52 may store additional subscriber information for a portable electronic device as well, including datebook (or calendar) information and recent call information. Alternatively, user identification information can also be programmed into the flash memory 30.

The portable electronic device 20 may be a battery-powered device and may include a battery interface 56 for receiving one or more rechargeable batteries 58. In at least some embodiments, the battery 58 can be a smart battery with an embedded microprocessor. The battery interface 56 may be connected to a regulator (not shown), which may assist the battery 58 in providing power V+ to the portable electronic device 20. Although current technology may make use of a battery, future technologies such as micro fuel cells may provide the power to the portable electronic device 20.

The portable electronic device 20 may also include an operating system 60 and software components 62 to 72 which are described in more detail below. The operating system 60 and the software components 62 to 72 that are executed by the main processor 22 are typically stored in a persistent store such as the flash memory 30, which may alternatively be a read-only memory (ROM) or similar storage element (not shown). Those skilled in the art will appreciate that portions of the operating system 60 and the software components 62 to 72, such as specific device applications, or parts thereof, may be temporarily loaded into a volatile store such as the RAM 28. Other software components can also be included, as is well known to those skilled in the art.

The subset of software applications 62 that control basic device operations, including data and voice communication applications, may typically be installed on the portable electronic device 20 during its manufacture. Other software applications may include a message application 64 that can be any suitable software program that allows a user of the portable electronic device 20 to send and receive electronic messages. Various alternatives exist for the message application 64 as is well known to those skilled in the art. Messages that have been sent or received by the user are typically stored in the flash memory 30 of the portable electronic device 20 or some other suitable storage element in the portable electronic device 20. In at least some embodiments, some of the sent and received messages may be stored remotely from the device 20 such as in a data store of an associated host system with which the portable electronic device 20 communicates.

The software applications can further include a device state module 66, a Personal Information Manager (PIM) 68, and other suitable modules (not shown). The device state module 66 may provide persistence, i.e. the device state module 66 ensures that important device data is stored in persistent memory, such as the flash memory 30, so that the data is not lost when the portable electronic device 20 is turned off or loses power.

The PIM 68 may include functionality for organizing and managing data items of interest to the user, such as, but not limited to, e-mail, contacts, calendar events, voice mails, appointments, and task items. A PIM application may have the ability to send and receive data items via the wireless network 1000. PIM data items may be seamlessly integrated, synchronized, and updated via the wireless network 1000 with the portable electronic device subscriber's corresponding data items stored and/or associated with a host computer system. This functionality creates a mirrored host computer on the portable electronic device 20 with respect to such items. This can be particularly advantageous when the host computer system is the portable electronic device subscriber's office computer system.

The portable electronic device 20 may also include a connect module 70, and an information technology (IT) policy module 72. The connect module 70 may implement the communication protocols that are required for the portable electronic device 20 to communicate with the wireless infrastructure and any host system, such as an enterprise system, with which the portable electronic device 20 is authorized to interface.

The connect module 70 may include a set of APIs that can be integrated with the portable electronic device 20 to allow the portable electronic device 20 to use any number of services associated with the enterprise system. The connect module 70 may allow the portable electronic device 20 to establish an end-to-end secure, authenticated communication pipe with the host system. A subset of applications for which access is provided by the connect module 70 can be used to pass IT policy commands from the host system to the portable electronic device 20. This can be done in a wireless or wired manner. These instructions can then be passed to the IT policy module 72 to modify the configuration of the device 20. Alternatively, in some cases, the IT policy update can also be done over a wired connection.

Other types of software applications can also be installed on the portable electronic device 20. These software applications can be third party applications, which are added after the manufacture of the portable electronic device 20. Examples of third party applications include games, calculators, utilities, etc.

The additional applications can be loaded onto the portable electronic device 20 through at least one of the wireless network 1000, the auxiliary I/O subsystem 40, the data port 42, the short-range communications subsystem 48, or any other suitable device subsystem 50. This flexibility in application installation may increase the functionality of the portable electronic device 20 and may provide enhanced on-device functions, communication-related functions, or both. For example, secure communication applications may enable electronic commerce functions and other such financial transactions to be performed using the portable electronic device 20.

The data port 42 may enable a subscriber to set preferences through an external device or software application and may extend the capabilities of the portable electronic device 20 by providing for information or software downloads to the portable electronic device 20 other than through a wireless communication network. The alternate download path may, for example, be used to load an encryption key onto the portable electronic device 20 through a direct and thus reliable and trusted connection to provide secure device communication.

The data port 42 can be any suitable port that enables data communication between the portable electronic device 20 and another computing device. The data port 42 can be a serial or a parallel port. In some instances, the data port 42 can be a USB port that includes data lines for data transfer and a supply line that can provide a charging current to charge the battery 58 of the portable electronic device 20.

The short-range communications subsystem 48 may provide for communication between the portable electronic device 20 and different systems or devices, without the use of the wireless network 1000. For example, the short-range communications subsystem 48 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download may be processed by the communication subsystem 24 and input to the main processor 22. The main processor 22 may process the received signal for output to the display 32 or alternatively to the auxiliary I/O subsystem 40. A subscriber may also compose data items, such as e-mail messages, for example, using the touch-sensitive overlay 34 on the display 32 that are part of the touch-sensitive display 38, and possibly the auxiliary I/O subsystem 40. The auxiliary I/O subsystem 40 may include devices such as: a mouse, track ball, infrared fingerprint detector, or a roller wheel with dynamic button pressing capability. A composed item may be transmitted over the wireless network 1000 through the communication subsystem 24.

For voice communications, the overall operation of the portable electronic device 20 may be substantially similar, except that the received signals may be output to the speaker 44, and signals for transmission may be generated by the microphone 46. Alternative voice or audio I/O subsystems, such as a voice message recording subsystem, can also be implemented on the portable electronic device 20. Although voice or audio signal output may be accomplished primarily through the speaker 44, the display 32 can also be used to provide additional information such as the identity of a calling party, duration of a voice call, or other voice call related information.

Figure 2:
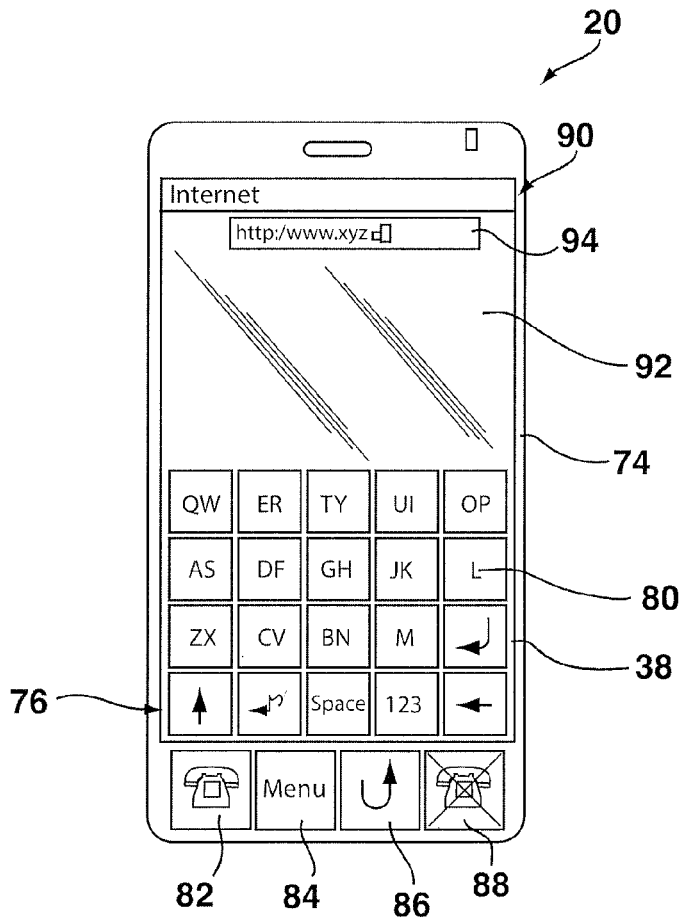
FIG. 2 is a front view of an example portable electronic shown in a portrait orientation.

Reference is now made to FIG. 2, which shows a front view of an example portable electronic device 20 in portrait orientation. The portable electronic device 20 may include a housing 74 that houses the internal components that are shown in FIG. 1 and frames the touch-sensitive display 38 such that the touch-sensitive display 38 is exposed for user-interaction therewith when the portable electronic device 20 is in use. In the example orientation shown in FIG. 2, the touch screen display 38 may include a portrait mode virtual keyboard 76 for user entry of data in the form of, for example, text during operation of the portable electronic device 20. It will be appreciated that such a virtual keyboard 76 may be used for data entry in any suitable application such as in an electronic mail application, during electronic mail composition or in any other suitable application. The portrait mode virtual keyboard 76 of FIG. 2 may be provided for data entry in an Internet browser application and is shown as a reduced keyboard for example purposes. The present disclosure is not limited to the portrait mode virtual keyboard 76 shown, as other keyboards including other reduced keyboards or full keyboards are possible. Suitable keyboards may include full or reduced QWERTY keyboards, full or reduced Dvorak keyboards, and other full or reduced keyboards, including keyboards adapted for non-Roman text input, such as Korean, Chinese or Japanese text input.

The touch-sensitive display 38 may be any suitable touch-sensitive display such as a capacitive touch-sensitive display. A capacitive touch-sensitive display 38 may include the display device, such as an LCD display 32 and the touch-sensitive overlay 34, in the form of a capacitive touch-sensitive overlay 34. It will be appreciated that the capacitive touch-sensitive overlay 34 may include a number of layers in a stack and may be fixed to the display 32 via a suitable optically clear adhesive. The layers can include, for example a substrate fixed to the LCD display 32 by a suitable adhesive, a ground shield layer, a barrier layer, a pair of capacitive touch sensor layers separated by a substrate or other barrier layer, and a cover layer fixed to the second capacitive touch sensor layer by a suitable adhesive. The capacitive touch sensor layers may be any suitable material such as patterned indium tin oxide (ITO).

Figure 3:
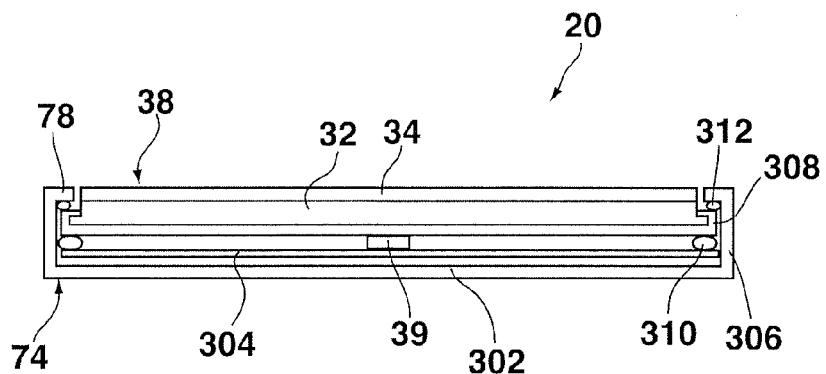
FIG. 3 is a simplified sectional side view of the portable electronic device of FIG. 2 (not to scale)

Reference is now made to FIG. 3, showing a simplified sectional side view of the portable electronic device of FIG. 2 (not to scale), with a tactile mechanism 39. As shown in FIG. 3, the housing 74 may include a back 302, a frame 78, which frames the touch-sensitive display 38, sidewalls 306 that extend between and generally perpendicular to the back 302 and the frame 78, and a base 304 that is spaced from and generally parallel to the back 302. The base 304 can be any suitable base and can include, for example, a printed circuit board or flex circuit board. The back 302 may include a plate (not shown) that is releasably attached for insertion and removal of, for example, the battery 58 and the SIM/RUIM card 52 described above. It will be appreciated that the back 302, the sidewalls 306 and the frame 78 can be injection molded, for example. In the example portable electronic device 20 shown in FIG. 2, the frame 78 may be generally rectangular with rounded corners although other shapes are possible.

The display 32 and the touch-sensitive overlay 34 can be supported on a support tray 308 of suitable material such as magnesium for providing mechanical support to the display 32 and touch-sensitive overlay 34. The display 32 and touch-sensitive overlay 34 may be biased away from the base 304, toward the frame 78 by biasing elements 310 such as gel pads between the support tray 308 and the base 304. Compliant spacers 312, which can also be in the form of gel pads for example, may be located between an upper portion of the support tray 308 and the frame 78. The touch-sensitive display 38 may be moveable within the housing 74 as the touch-sensitive display 38 can be moved toward the base 304, thereby compressing the biasing elements 310. The touch-sensitive display 38 can also be pivoted within the housing 74 with one side of the touch-sensitive display 38 moving toward the base 304, thereby compressing the biasing elements 310 on the same side of the touch-sensitive display 38 that moves toward the base 304.

In the present example, a tactile mechanism 39 may be supported on one side of the base 304 which can be a printed circuit board while the opposing side provides mechanical support and electrical connection for other components (not shown) of the portable electronic device 20. The tactile mechanism 39 can be located between the base 304 and the support tray 308. The tactile mechanism 39, which may be a piezoelectric assembly, for example, may be located in any suitable position to provide adequate tactile feedback to an interaction with the touch-sensitive display 38. In the present embodiment the tactile mechanism 39 may be in contact with the support tray 308. Thus, actuation of the tactile mechanism 39, for example by a displacement towards or away from the touch-sensitive display 38, may provide the user with a positive tactile feedback during user interaction with the user interface of the portable electronic device 20. It will be appreciated that the tactile mechanism 39 may be actuated in response to a signal, for example from the processor 22, which may in turn be in response to a physical force sensed at the touch-sensitive display 38, to indicate a user interaction. Although a single tactile mechanism 39 is shown any suitable number of tactile mechanisms 39 can be used.

A touch event may be detected upon user touching of the touch-sensitive display 38. Such a touch event can be determined upon a user touch at the touch-sensitive display 38 for selection of, for example, a feature in a list, such as a message or other feature for scrolling in the list or selecting a virtual input key. Signals may be sent from the touch-sensitive overlay 34 to the controller 36 when a suitable object such as a finger or other conductive object held in the bare hand of a user, is detected. Thus, the touch event may be detected and the X and Y location of the touch may be determined. The X and Y location of the touch may be determined to fall within the touch-sensitive area defined by the boundary on the touch-sensitive display 38.

In the present example, the X and Y location of a touch event may be both determined with the X location determined by a signal generated as a result of capacitive coupling with one of the touch sensor layers and the Y location determined by the signal generated as a result of capacitive coupling with the other of the touch sensor layers. Each of the touch-sensor layers may provide a signal to the controller 36 as a result of capacitive coupling with a suitable object such as a finger of a user or a conductive object held in a bare hand of a user resulting in a change in the electric field of each of the touch sensor layers. The signals may represent the respective X and Y touch location values. It will be appreciated that other attributes of the user's touch on the touch-sensitive display 38 can be determined. For example, the size and the shape of the touch on the touch-sensitive display 38 can be determined in addition to the location (e.g., X and Y values) based on the signals received at the controller 36 from the touch sensor layers.

Referring again to FIG. 2, it will be appreciated that a user's touch on the touch-sensitive display 38 may be determined by determining the X and Y touch location and user-selected input may be determined based on the X and Y touch location and the application executed by the processor 22. This determination may be carried out by the processor 22 using one or more software modules 62, including the specific application being executed. In the example screen shown in the front view of FIG. 2, the application may provide the virtual keyboard 76 having a plurality of virtual input keys or buttons, which can be selected by the user. The user selected virtual input key may be matched to the X and Y touch location. Thus, the button selected by the user may be determined based on the X and Y touch location and the application. In the example shown in FIG. 2, the user may enter text via the virtual keyboard 76, selecting characters or symbols associated with the virtual input keys, such as alphanumeric characters from the virtual keyboard 76 by touching the touch-sensitive display at the location of the characters, corresponding to the virtual input keys, of the virtual keyboard 76. In example embodiments of the portable electronic device 20, the text or data entry may be accomplished by a "click to enter" operation. Once the user has selected a character or symbol, the character or symbol may be entered by depressing the virtual input key on the touch-sensitive display 38 with sufficient force to overcome the bias of the touch-sensitive display 38, to cause movement of the touch-sensitive display 38. The selection of the virtual input key 80 (e.g., based on the X and Y location on the touch-sensitive display) may result in signals that may be received by the main processor 22, thereby entering the corresponding character or symbol for rendering on the touch-sensitive display. The processor 22 may also correspondingly send a signal to the tactile mechanism 39 to flex inwards or outwards, for example in the case of a piezoelectric assembly, to provide a tactile feedback to the user. The "click to enter" operation may provide a tactile feedback confirming the entry to the user, thereby reducing the chance of inadvertent double entry requiring correction. This may also reduce the need for additional user interaction and use time thereby reducing battery consumption. The click entry may also allow the user to touch the device and ensure the correct character or symbol is selected before entry of that character or symbol by clicking. In general, the characters may be alphanumeric characters, although other characters may also be possible, such as characters for non-English languages.

According to the present example as illustrated in FIG. 2, the main processor 22 may receive a user-selection of an Internet browser application for browsing the Internet by, for example, determination of a touch event at an Internet browser icon (not shown) displayed on the touch-sensitive display 38.

For illustrative purposes, the virtual keyboard 76 may be rendered in the portrait mode as shown in FIG. 2. Devices, such as accelerometers, can be used to determine the relative orientation of the portable electronic device 20 and change the orientation of the touch-sensitive display accordingly. The virtual input keys or buttons 80 may be rendered with the alphanumeric characters and other keyboard buttons displayed in an upright position for the user. The portable electronic device 20 can be operated in any suitable mode for determining a user-desired one of the letters upon determination of a touch event at the respective one of the virtual input keys buttons 80 of the virtual keyboard 76. For example, letters can be selected using a single-tap mode, multi-tap mode, a text prediction mode or using any other suitable mode. The portable electronic device 20 according to the present example may also include four physical buttons 82, 84, 86, 88 in the housing 74 for user-selection for performing functions or operations including an "off-hook" button 82 for placing an outgoing cellular telephone call or receiving an incoming cellular telephone call, a Menu button 84 for displaying a context-sensitive menu or submenu, an escape button 86 for returning to a previous screen or exiting an application, and an "on-hook" button 88 for ending a cellular telephone call. The remainder of the buttons shown on the face of the example portable electronic device of FIG. 2 may be virtual buttons or input keys 80 on the touch-sensitive display 38.

Along with the virtual keyboard 76, a display area may be rendered, which in the present example may be a portrait mode display area 90 that is a portrait mode Internet browser display screen 92. The display area may be provided in the portrait mode as a result of determination of the orientation at the accelerometer (not shown). The display area may be rendered above the portrait mode virtual keyboard 76 when the portable electronic device 20 is in the portrait orientation.

As a result of user touching any of the virtual buttons or input keys 80 of the virtual keyboard 76, data input received from the virtual keyboard 76 may be rendered in a data entry field 94 of the Internet browser display screen 92. As shown, input may be received in the form of user selection of characters or symbols by touching the virtual buttons or input keys 80 so as to select the desired character or symbol associated with the virtual button or input key 80 in either the portrait mode or landscape mode. In the example shown in FIG. 2, the user enters "http://www.xyz.c" and the data received may be displayed in the data entry field 94 of the portrait mode Internet browser display screen 92.

When entering data, the user may turn the portable electronic device 20 to a different orientation to provide a different keyboard layout such as to change from a reduced keyboard layout in the portrait orientation to a full keyboard layout in the landscape orientation, as in the present example.

In another example, the user may also choose to turn the portable electronic device 20 to provide a different display area for the application.

Figure 4A:
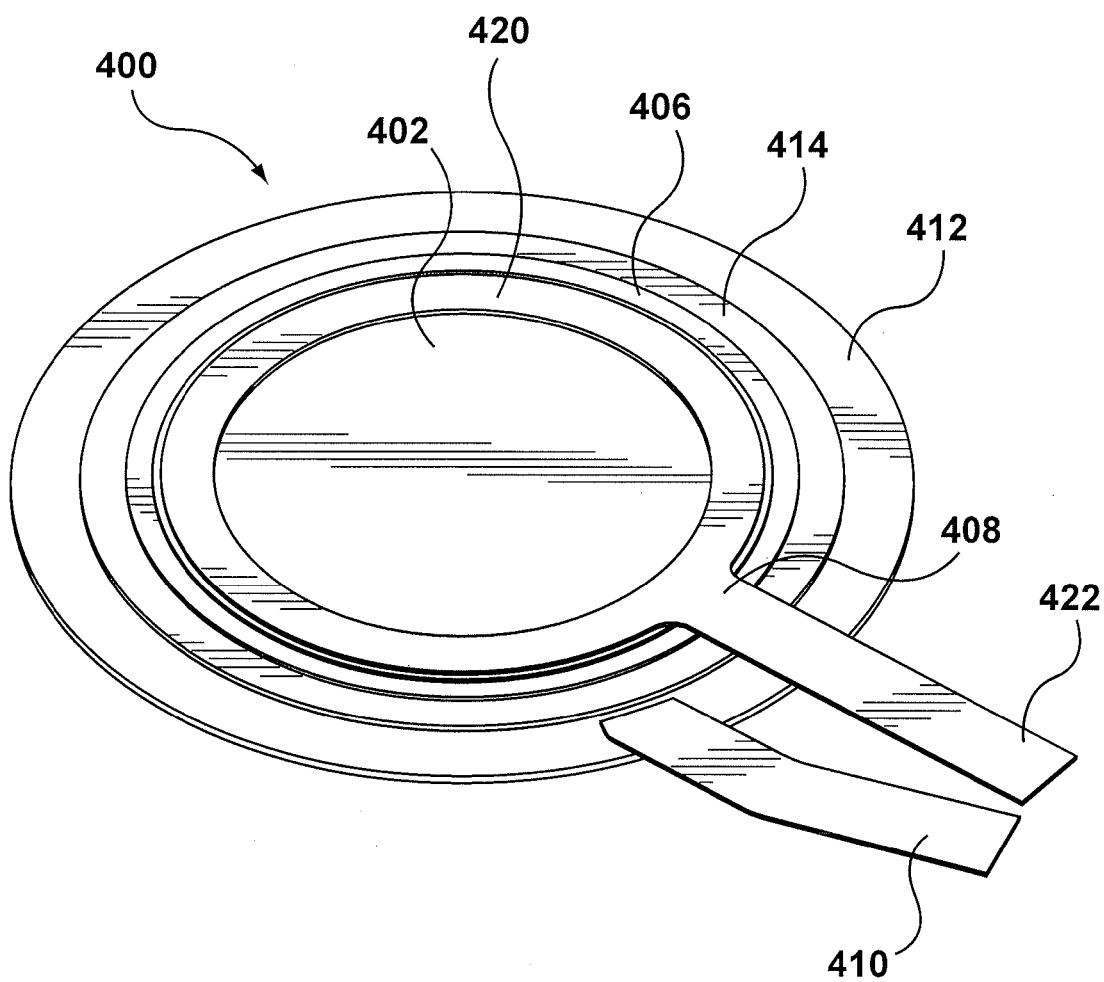
FIG. 4A is a schematic diagram illustrating an example embodiment of a piezoelectric assembly.
Figure 4B:
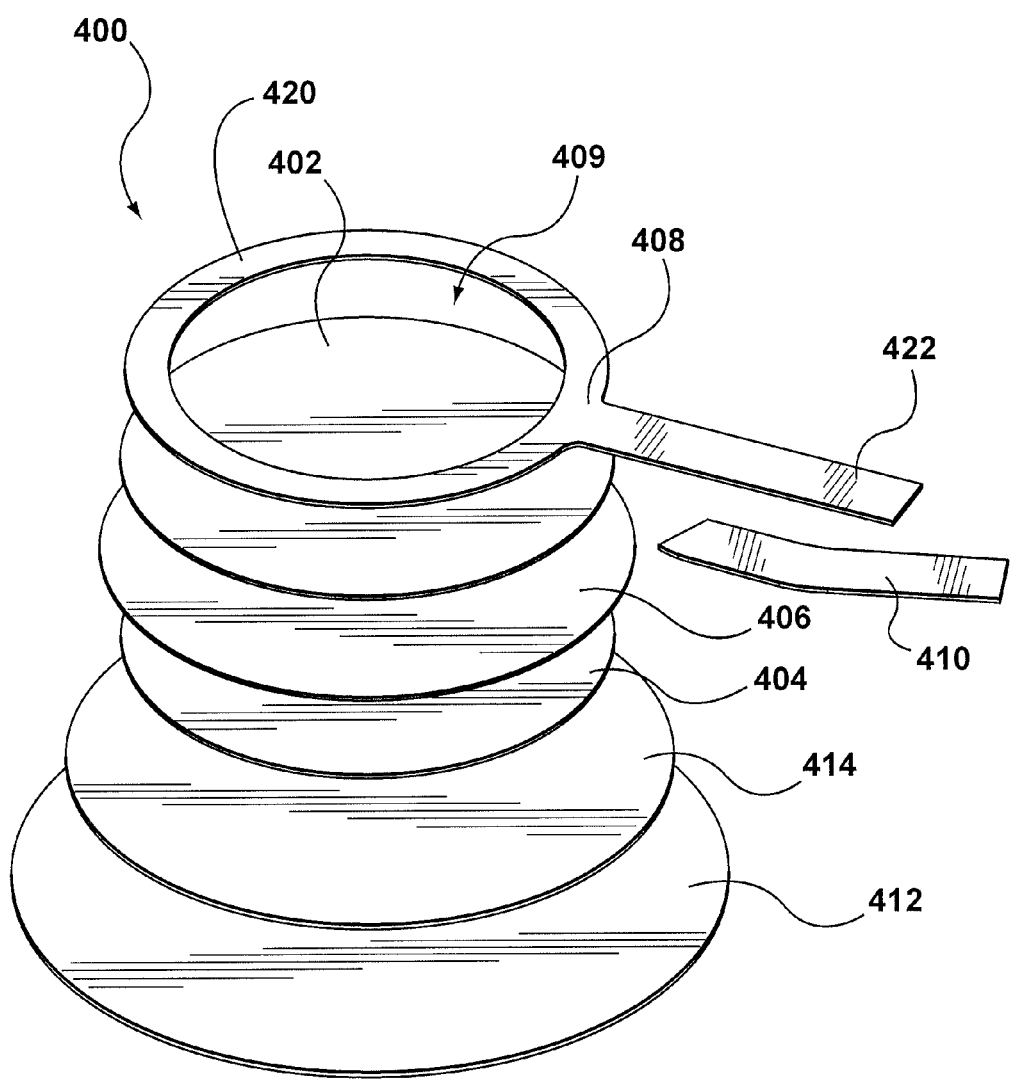
FIG. 4B is an exploded schematic diagram of the example embodiment of FIG. 4A.

Reference is now made to FIGS. 4A and 4B which illustrate an example embodiment of a piezoelectric assembly 400 which may be used to implement the tactile mechanism 39 in some embodiments. FIG. 4A schematically illustrates the piezoelectric assembly 400. FIG. 4B shows the piezoelectric assembly 400 in an exploded schematic.

The piezoelectric assembly 400 comprises a first electrode 402 and a second electrode 404. The first electrode 402 and the second electrode 404 are spaced apart from each other. The first electrode 402 is in electrical communication with a power source, such as a current or voltage source. The second electrode 404 is in electrical communication with a reference source (e.g., a ground source). When electrical power, such as an electrical signal, is applied to the first electrode 402, an electric field is generated between the first and second electrodes 402, 404.

In the shown example, the first and second electrodes 402, 404 are disc-shaped although any suitable geometry may be possible. Each of the first and second electrodes 402, 404 having a pair of opposed side surfaces connected by an edge surface. In this example, the first electrode 402 has a diameter of about 13 mm and the second electrode 404 has a diameter of about 13 mm. The first and second electrodes 402, 404 may be made of any suitable electrically conductive material that may accommodate flexing or displacement in the piezoelectric assembly such as, for example, a silver material.

A piezoelectric element 406 is disposed between the first and second electrodes 402, 404 and is in electrical communication with each of the first and second electrodes 402, 404. The piezoelectric element 406 is made from a piezoelectric material such as a piezoelectric ceramic, for example, lead zirconate titanate (PZT). In this example, the electrical communication between the piezoelectric element 406 and the first and second electrodes 402, 404 is provided through direct contact. In some example embodiments, the piezoelectric element 406 may be designed to match the geometries of the first and second electrodes 402, 404, for example by being disc-shaped. In this example, the piezoelectric element 406 has a diameter of about 14 mm and is about 0.1 mm thick.

The piezoelectric material 406 has an unactuated state and an actuated state. In the absence of an electric field, the piezoelectric element 406 exhibits the unactuated state. For example, the piezoelectric element 406 may have an unflexed or unexpanded condition in the absence of the electric field. In the presence of an electrical field generated between the first and second electrodes 402, 404, for example when an electric field is generated between the first and the second electrodes 402, 404, the piezoelectric element 406 exhibits an actuated state. For example, the piezoelectric element 406 may have a flexed or expanded condition in the presence of an electric field. In the example shown, the first and second electrodes 402, 404, are bonded directly to the piezoelectric element 406, for example by silkscreening thin (e.g., 1-5 microns thick) silver first and second electrodes 402, 404 on opposing surfaces of the piezoelectric element 406.

The piezoelectric assembly 400 is in electrical communication (e.g., for receiving or transmitting signals) with other components of the electronic device 20 via electrical connectors. In the example shown, the piezoelectric assembly 400 has a signal electrical connector 408 and a reference electrical connector 410. The signal electrical connector 408 is in electrical communication with the first electrode 402, for example through contact engagement with the outwardly facing side surface of the first electrode 402 referred to herein as the contact surface, to provide electrical communication between the first electrode 402 and the current or voltage source. The inwardly facing side surface of the first electrode 402 contacts the piezoelectric element 406. Similarly, the reference electrical connector 410 is in electrical communication with the second electrode 404, to provide electrical communication between the second 404 and the reference source (e.g., ground source). The signal electrical connector 408 and the reference electrical connector 410 may each be formed from a flexible printed circuit board (PCB), which may in turn be connected to or extensions from other components of the electrical device 20, such as other circuits. The flexible PCB comprises at least one circuit (e.g., silver circuits) on a flexible plastic substrate. The substrate may be a flexible polymer such as polyimide, PEEK or polyester. Generally, the signal and reference electrical connectors 408, 410 may be made of a material that is more resistant to fatigue than the first and second electrodes 402, 404 and the piezoelectric element 406.

Figure 9:
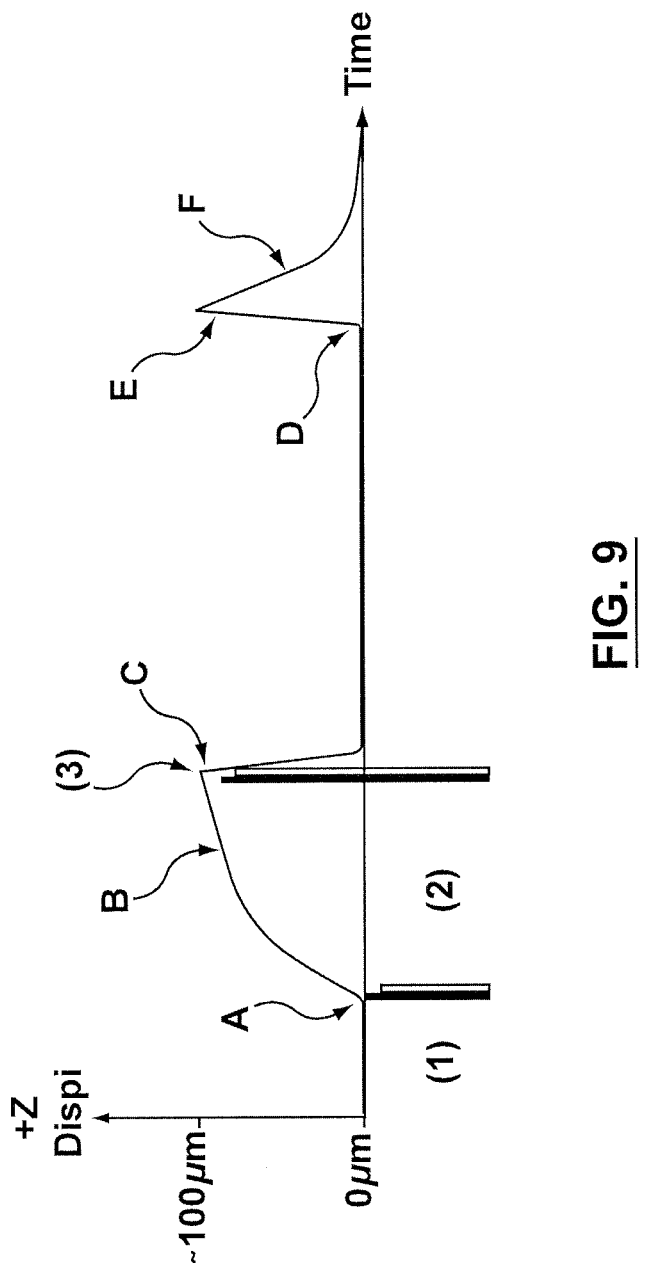
FIG. 9 is a chart illustrating displacement of an example embodiment of a piezoelectric assembly in operation.

Reference is now made to FIG. 9, which is a chart illustrating the displacement of an example embodiment of the piezoelectric assembly 400 in operation. The piezoelectric assembly 400 may be used as the tactile mechanism 39 described above.

At (1), when the piezoelectric assembly 400 does not receive a signal, there may be no electric field generated between the first and second electrodes 402, 404, and the piezoelectric element 406 may be in its unactuated state. The piezoelectric element 406 may be concaved downwards from the general plane formed by its peripheral edge such that it is concaved away from the touch-sensitive display 38, causing a corresponding configuration of the piezoelectric assembly 400.

At (A), in response to an initial touch input at the touch-sensitive display 38, the piezoelectric assembly 400 receives a signal, for example from the processor 22, causing the generation of an electric field between the first and second electrodes 402, 404 and a subsequent change of the piezoelectric element 406 to its actuated state, which in this example brings the piezoelectric element 406 (and by extension the piezoelectric assembly 400) to be substantially planar with its peripheral edge and substantially flush or in contact with the touch-sensitive display 38. This change to the actuated state typically occurs gradually enough to be unnoticeable by a user, as shown by the gradual rise (B). In this example, the piezoelectric assembly 400 exhibits a displacement of about 100 microns over about 20 ms from the unactuated to the actuated state.

Over the time period (2), the touch input at the touch-sensitive display 38 exerts further force on the touch-sensitive display 38, the force sensed by the touch-sensitive display 38 increases until a predetermined threshold is reached at (3) and the touch input is determined to be a full touch input. When the full touch input is determined, the signal to the piezoelectric assembly 400 is stopped, causing the dissipation of the generated electric field between the first and second electrodes 402, 404 and a subsequent change of the piezoelectric element 406 back to its unactuated state (and by extension the piezoelectric assembly 400), which in this example is concaved away from the touch-sensitive display 38. The change back to the unactuated state typically is relatively rapid so that the user feels the change, as shown by the sharp drop (C). In this example, the piezoelectric assembly 400 exhibits a displacement of about 100 microns over about 3 ms from the actuated to the unactuated state.

For the duration that the full touch input is maintained on the touch-sensitive display 38, the piezoelectric assembly 400 remains unactuated. At (D) the touch input is removed, and this is sensed by the touch-sensitive display 38. When the removal of the touch input is determined, a signal is sent to the piezoelectric assembly 400, again generating the electric field between the first and second electrodes 402, 404 and a subsequent change of the piezoelectric element 406 to its actuated state (and by extension the piezoelectric assembly 400), substantially flush with the touch-sensitive display 38. Typically, this occurs relatively rapidly such that the change is felt by the user, as shown by the sharp rise (D). In this example, the piezoelectric assembly 400 exhibits a displacement of about 100 microns over about 3 ms from the unactuated to the actuated state.

At (E), the signal to the piezoelectric assembly 400 is stopped, causing the generated electric field between the first and second electrodes 402, 404 to dissipate and thus the return of the piezoelectric element 406 to its unactuated state (and by extension the piezoelectric assembly 400). The piezoelectric assembly 400 typically exhibits a gradual return to the unactuated state, as shown by the gradual drop (F). In this example, the piezoelectric assembly 400 gradually returns to its unactuated state over about 15 ms.

Thus, a user using a touch input on the touch-sensitive display 38 may initially feel a resistance in response to an initial touch input, as the piezoelectric assembly 400 changes to its substantially planar actuated state. As the touch input presses further down, the user may feel a give or clicking sensation, as the piezoelectric assembly 400 returns to its concave unactuated state. When the touch input is released, the user may feel an upwards clicking sensation, as the piezoelectric assembly 400 changes to its actuated state again, before finally relaxing back to its unactuated state.

This behaviour may be useful to provide tactile feedback for the touch-sensitive display 38. However, this repeated change of the piezoelectric element 406 between the actuated and unactuated states, may cause fatigue in the piezoelectric element 406, the first electrode 402 and/or the second electrode 404, due to the repeated flexing or changes in shape of the piezoelectric assembly 400. This may lead to crack formation, particularly in the piezoelectric element 406 or the first electrode 402. For example, the first electrode 402 may crack such that it is separated into two or more distinct portions. As such, only those portions in contact with the signal electrical connector 408 may receive an electrical signal from the signal electrical connector 408. This typically results in the generation of a weakened or lessened electric field, causing a lessened actuation of the piezoelectrical material 406. This lack of electrical communication of some portions of the first electrode 402 may also cause arcing in the first electrode 402 between a portion receiving the signal and a portion not receiving the signal. One or both of these responses may result in an inadequate or undesirable tactile feedback.

The signal electrical connector 408 is designed to be in contact engagement with at least a portion of the contact surface of the first electrode 402. The signal electrical connector has a contact portion 420 disposed in contact engagement with the contact surface of the first electrode 402 and a lead portion 422 which connects to the power source. The contact portion 420 of signal electrical connector 408 has a relatively large surface area or forms multiple points of contact with the contact surface of the first electrode 402. This allows the contact portion 420 to maintain contact and electrical communication between the different portions (e.g., oppositely located portions) of the contact surface even when a crack develops and extends through the first electrode 402.

In the shown example of FIGS. 4A and 4B, the first and second electrodes 402, 404 are disc-shaped and the signal electrical connector 408 is designed to be in contact engagement with substantially the entire peripheral surface area of the first electrode 402, thereby maintaining contact and electrical communication with the at least a portion of the contact surface of the first electrode 402 even when a crack develops and extends through the first electrode 402. The term peripheral surface area means the surface area of the first electrode 402 that is adjacent or substantially adjacent to the periphery of the first electrode 402, and is not necessarily limited to surface areas directly adjacent to the periphery of the first electrode 402.

Generally, the signal electrical connector 408 may be designed with a piezoelectric material-accommodating space 409 for accommodating actuation of the piezoelectric element 406 as shown in FIG. 4B. This piezoelectric material-accommodating space 409 may reduce the rigidity of the piezoelectric assembly 400, thus reducing the work required by the piezoelectric element 406 to actuate, thereby allowing an increased response and increased tactile feedback. The signal electrical connector 408 may be electrically connected or attached to the first electrode 402 using a conductive adhesive (not shown), such as a conductive pressure sensitive adhesive (CPSA).

Figure 4C:
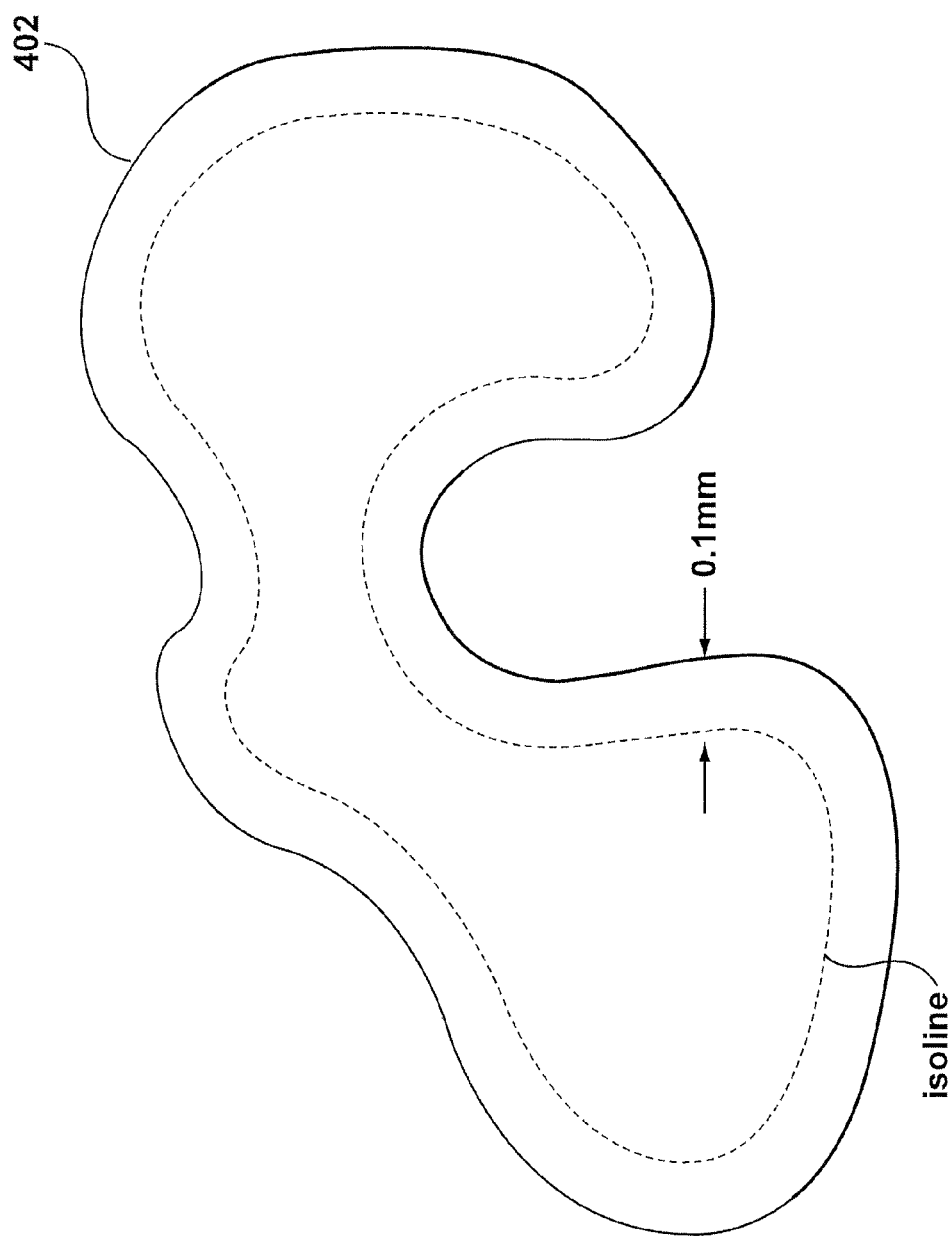
FIG. 4C illustrates an isoline.

In some embodiments, the signal electrical connector 408 is in contact engagement with at least a portion of an isoline of the contact surface of the first electrode 402. The isoline is defined on the contact surface of the first electrode 402 and spaced inwardly from and about the entire periphery of the contact surface on which the isoline is defined. The isoline, in some example embodiments, is spaced inwardly from a peripheral edge of the first electrode 402 by a constant minimum distance and about the entire periphery of the side surface of the first electrode 402. An example of an isoline is illustrated in FIG. 4C. In some example embodiments, the constant minimum distance is 2 mm or less. In some example embodiments, the constant minimum distance is 0.1 mm as shown in FIG. 4C. The signal electrical connector 408 is disposed in contact with at least 10% of the isoline. The signal electrical connector 408 is typically in contact engagement with a majority of an isoline of the first electrode 402. In some example embodiments, the signal connector 408 is disposed in contact with at least 25% of the isoline. In some example embodiments, the signal electrical connector 408 is in contact with at least 50% of the isoline. In some example embodiments, the signal electrical connector 408 is in contact with at least 75% of the isoline. In some example embodiments, the signal electrical connector 408 is in contact with the entire isoline.

In some embodiments, signal electrical connector 408 is in contact engagement with a side surface of the first electrode 402 over at least 5% of the surface area of the side surface of the first electrode 402. In some example embodiments, the contact engagement with the first electrode 402 covers at least 10% of the surface area of the side surface of the first electrode 402. In some example embodiments, the contact engagement with the first electrode 402 covers at least 20% of the surface area of the side surface of the first electrode 402.

In another example, where the first electrode 402 is disc-shaped, portions of the isoline form arcs, and the signal electrical connector 408 is in contact engagement with a side surface of the first electrode 402 over an arc adjacent or substantially adjacent to the periphery of the side surface of the first electrode 402. In some example embodiments, the contact engagement with the side surface of the first electrode 402 covers an arc of at least 180°. In some example embodiments, the contact engagement with the side surface of the first electrode 402 covers an arc of at least 270°. In some example embodiments, the contact engagement with the side surface of the first electrode 402 covers a full 360° adjacent or substantially adjacent to the peripheral edge.

In the example shown in FIGS. 4A and 4B, the signal electrical connector 408 is hoop shaped (also referred to as a ring or annular shape) forming a hoop shaped contact portion ("hoop") such that the contact engagement between the signal electrical connector 408 and the first electrode 402 is about the complete periphery of a side surface of the first electrode 402 while defining a piezoelectric material-accommodating space 409 within. The hoop shaped contact portion has a width of 1.5 mm or less in some embodiments.

In some example embodiments, the piezoelectric assembly 400 includes a substrate 412, such as a shim, supporting the second electrode 404. The substrate 412 is connected to the reference electrical connector 410, for example through a solder connection such as a laser solder or induction solder connection. For example, the substrate 412 is any suitable electrically conductive material, such as a nickel alloy, and is suitably thick to provide support for the piezoelectric assembly 400. In this example, the substrate is about 0.10 mm to about 0.15 mm thick and be disc-shaped, with a diameter of about 20 mm. The substrate 412 is designed to optimize or improve the mechanical response of the piezoelectric assembly 400, for example by providing robustness while allowing the piezoelectric element 406 to actuate or flex. The substrate 412 is in electrical communication with the second electrode 404 and in contact engagement with the reference electrical connector 410 so as to provide electrical communication between the second electrode 404 and the reference electrical connector 410.

For example, the second electrode 404 is fixed on the substrate 412 and in electrical communication with the substrate 412, for example through the use of an electrically conductive adhesive 414. In an example, the electrically conductive adhesive 414 is a graphite acrylic adhesive and is provided as a thin disc, for example about 0.01 mm in thickness.

In other embodiments, the contact portion 420 may be configured to extend between different portions of the contact surface, for example, the contact portion 420 may be an elongate member which extends between two halves of the contact surface of the first electrode 402. The signal electrical connector 408 may be a diffuse connector spreading out or extending across a least a portion of the contact surface of the first electrode 402. In such embodiments, the contact portion 420 may have a branching or leaf-like configuration having a number of projections contacting different locations of the contact surface of the first electrode 402. The branching or leaf-like configuration may comprise a number of projections extending from a common reference, such as an elongate member which acts a spine or backbone or a centre. In yet other embodiments, the contact portion 420 of signal electrical connector 408 may provide multiple points of contact with the contact surface of the first electrode 402 via multiple solder connections spaced apart on contact surface of the first electrode 402.

Figure 5A:
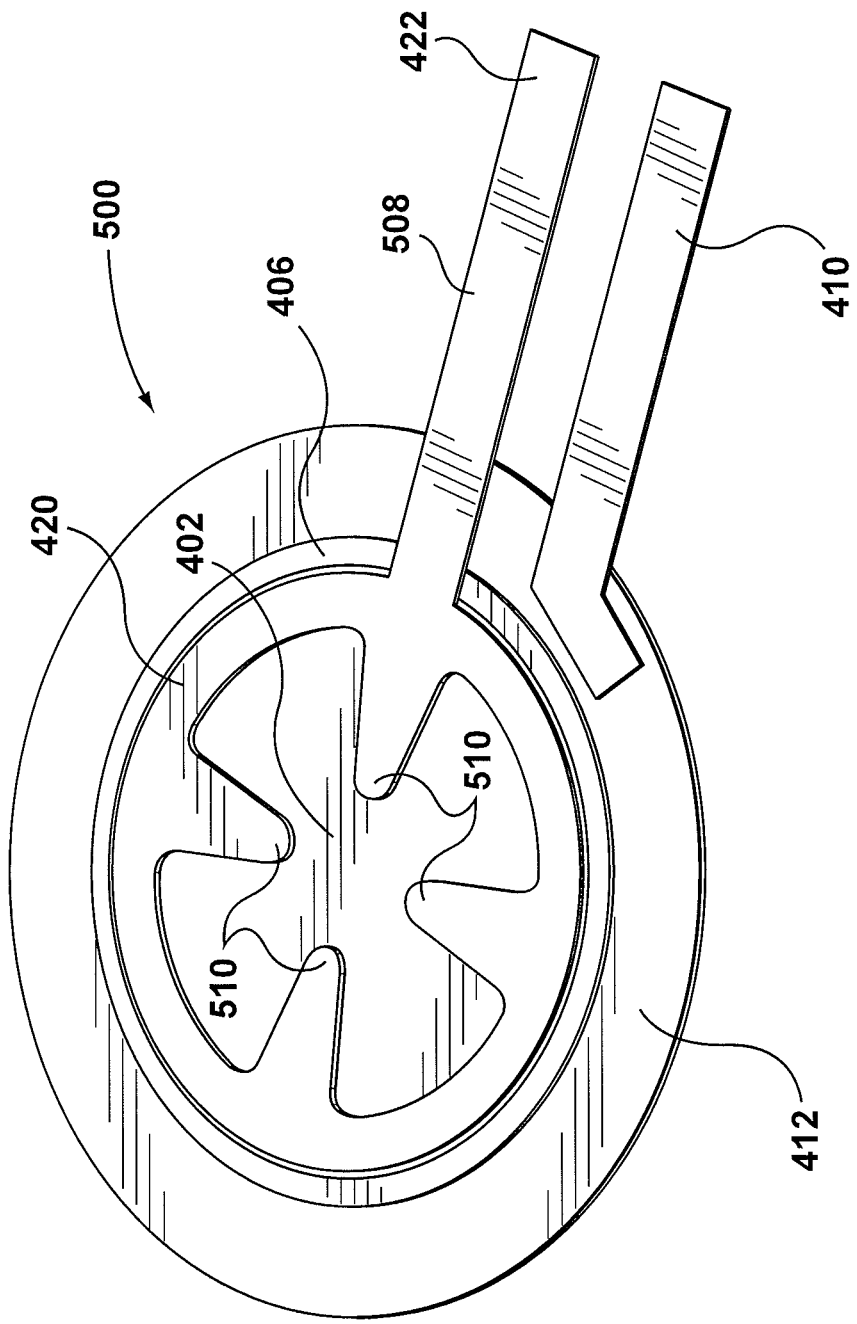
FIG. 5A is a schematic diagram illustrating another example embodiment of a piezoelectric assembly.
Figure 5B:
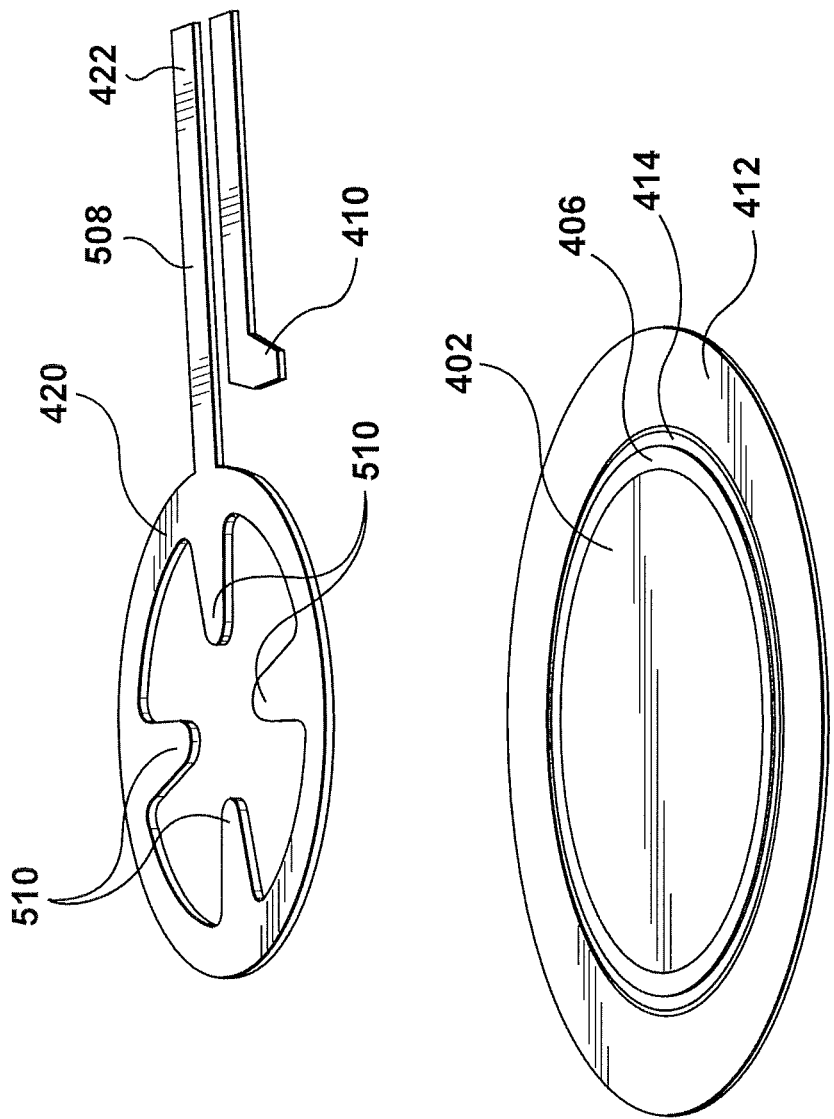
FIG. 5B is a partially exploded schematic diagram of the piezoelectric assembly of FIG. 5A with the signal electrical connector and reference electrical connector shown in isolation from the rest of the piezoelectric assembly.

FIGS. 5A and 5B illustrate another example embodiment of a piezoelectric assembly 500. The components and design of the piezoelectric assembly 500 are generally similar to those described above for the piezoelectric assembly 400, with differences as described below. In this example, the piezoelectric assembly 500 comprises a signal electrical connector 508 generally similar to the signal electrical connector 408 described above, further including one or more surfaces extending inwards from the periphery of the first electrode 402 for contact engagement with the first electrode 402. In the example shown, the signal electrical connector 508 includes a number of extensions 510 extending radially inwardly from the hoop shaped contact portion. For example, such a design is useful for increasing the area of contact engagement between the signal electrical connector 508 and the first electrode 402. For example, an increased contact engagement area improves electrical communication between the signal electrical connector 508 and the first electrode 402. Specifically, an increased contact engagement area provides a more robust electrical and physical contact, particularly where a conductive adhesive, such as a conductive pressure sensitive adhesive, is used to couple the signal electrical connector 508 to the first electrode 402.

Figure 6:
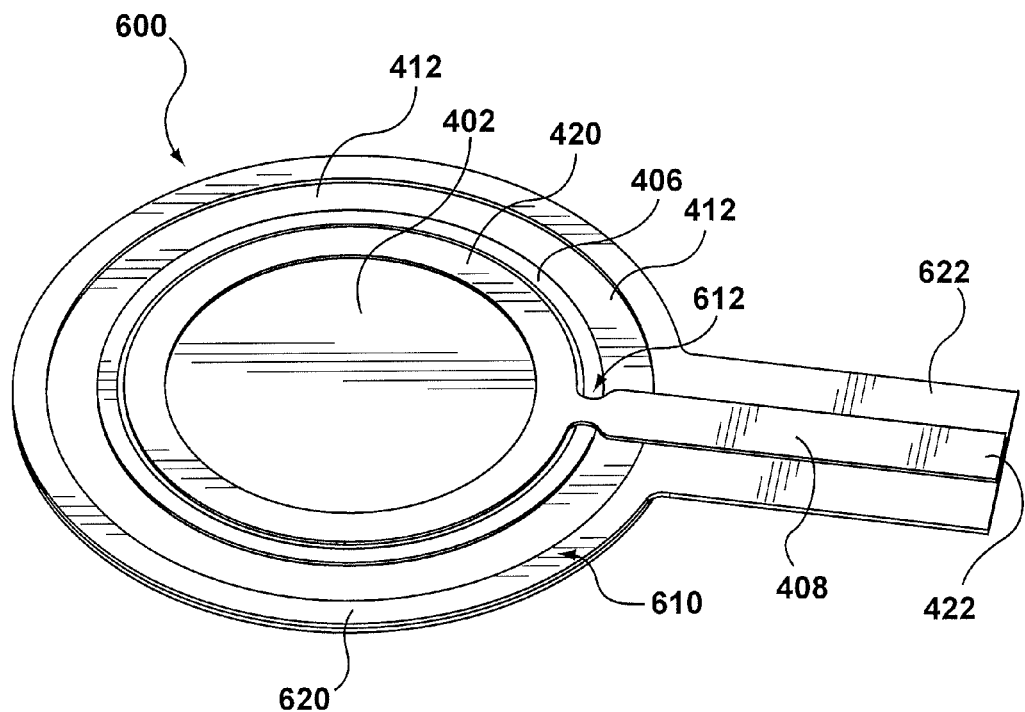
FIG. 6 is a schematic diagram illustrating another example embodiment of a piezoelectric assembly.

FIG. 6 illustrates another example embodiment of a piezoelectric assembly 600. The components and design of the piezoelectric assembly 600 are generally similar to those described above for the piezoelectric assembly 400, with differences as described below. In this example, the piezoelectric assembly 600 comprises a reference electrical connector 610 comprises a contact portion 620 having a hoop shape forming a hoop shaped contact portion such that the contact portion 620 is disposed in contact engagement with the contact surface of the second electrode 404 similar to the signal electrical connector 408 described above in connection with FIGS. 4A and 4B. The reference electrical connector 610 also has a lead portion 622 which connects to the reference source. The reference electrical connector 610 is designed to have a greater contact engagement area with the electrically conductive substrate 412 (e.g., shim) than the area available with a point contact such as a solder connection. The reference electrical connector 610 is in contact with at least 5% of the surface area of a side surface of the substrate 412, but in some example embodiments may be in contact with at least 10% of the surface area of a side surface of the substrate 412 or at least 20% of the surface area of a side surface of the substrate 412.

In the example shown in FIG. 6, the hoop shaped contact portion 620 of the reference electrical connector 610 is in contact with the entire periphery surface area of the substrate 412. By providing an increased contact engagement area between the reference electrical connector 610 and the substrate 412, a more robust electrical connection is provided between the reference electrical connector 610 and the substrate 412, using a conductive adhesive, such as a conductive pressure sensitive adhesive. The use of a conductive adhesive may address some challenges associated with other types of electrical coupling, for example a solder connection. Formation of a solder connection may be a time-consuming part of the manufacturing process, and the soldering process, on account of the conditions involved, may introduce fatigue or stress at the solder point, which may decrease the robustness of both the connection and the pieces being connected. The hoop shaped contact portion 620 of the reference electrical connector 610 avoids problems with solder connections, including the need accommodate the solder tail, and reduces the need for a separate soldering station which may reduce overall production costs.

The reference electrical connector 610 may be a flexible PCB as described above. In shown embodiment, reference electrical connector 610 has a lead portion 622 in the form of a connection pad which connects to the reference source, which may be wider than a typical electrical connector.

Figure 7:
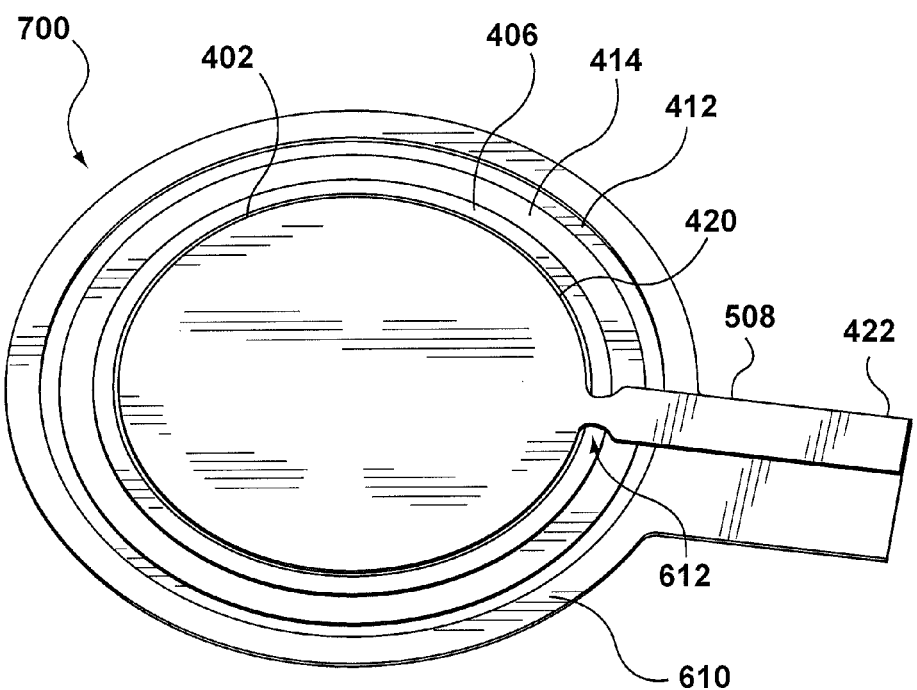
FIG. 7 is a schematic diagram illustrating a further example embodiment of a piezoelectric assembly.

FIG. 7 illustrates another example embodiment of a piezoelectric assembly 700. The components and design of the piezoelectric assembly 700 are generally similar to those described above. In this example, the piezoelectric assembly 700 comprises a signal electrical connector 508 as described above in connection with FIGS. 5A and 5B, and a reference electrical connector 610 as described above in connection with FIG. 6.

Referring to both FIGS. 6 and 7, the signal electrical connector 408 of the piezoelectric assembly 600 or signal electrical connector 508 of the piezoelectric assembly 700 may have a neck portion 612 where the contact portion of the signal electrical connector meets the lead portion of the signal electrical connector near or at the peripheral edge surface of the piezoelectric element 406, as shown in FIGS. 6 and 7. The neck portion 612 is tapered to have a width less than the width of the lead portion 422. This reduces the stress on the piezoelectric assembly when the piezoelectric material 406 expands and reduces the work required by the piezoelectric element 406 to actuate, thereby allowing an increased response and increased tactile feedback. In the shown embodiments, the outer edge surface of the signal electrical connector 408, 508 narrows/tapers where the hoop shaped contact portion 420 meets an elongate lead portion 422 extending radially from the hoop shaped contact portion 420.

Figure 8:
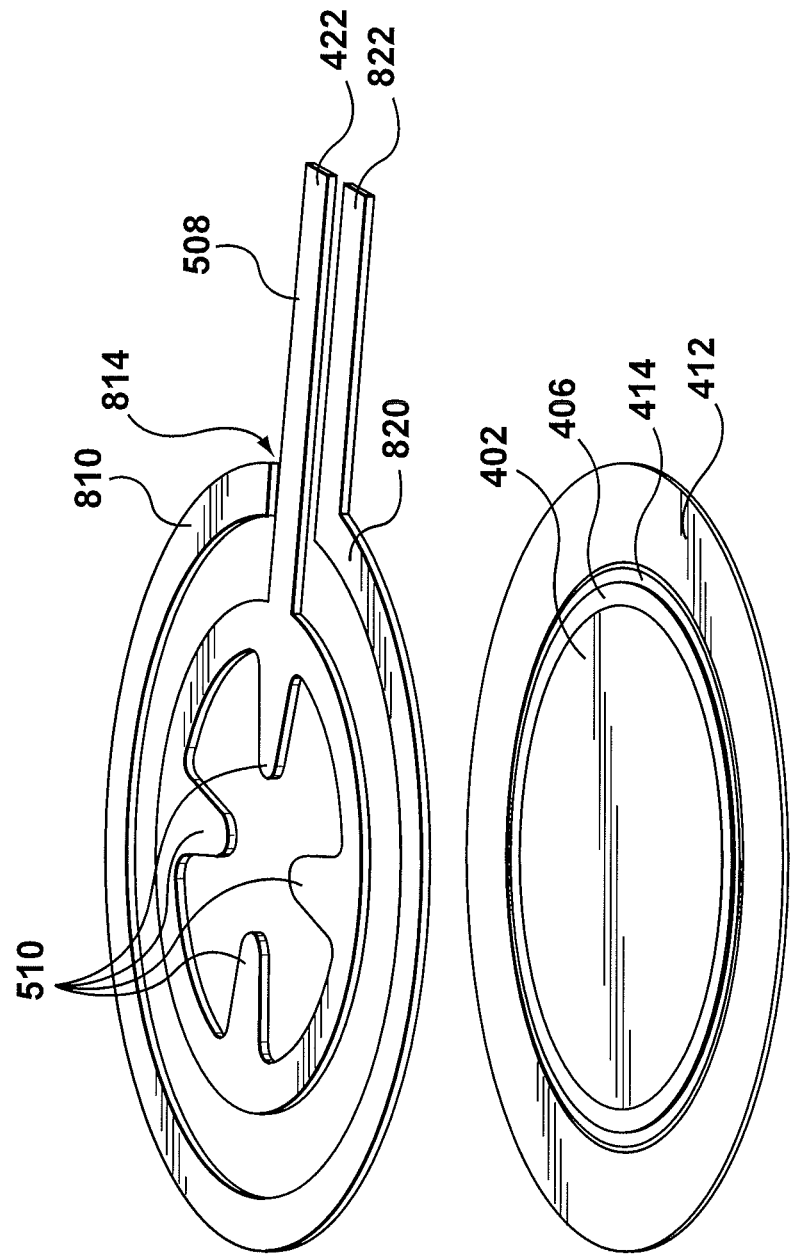
FIG. 8 is a partially exploded schematic diagram illustrating a further example embodiment of a piezoelectric assembly with the signal electrical connector and reference electrical connector shown in isolation from the rest of the piezoelectric assembly.

FIG. 8 illustrates another example embodiment of a piezoelectric assembly 800. The components and design of the piezoelectric assembly 800 are generally similar to those described above, with differences as described below. In this example, the piezoelectric assembly 800 comprises a signal electrical connector 508 having a hoop shaped contact portion as described above in connection with FIGS. 5A and 5B. However, a signal electrical connector 408 as described above in connection with FIGS. 4A and 4B could be used in other embodiments. The piezoelectric assembly includes a reference electrical connector 810 which is designed to have a greater contact engagement area with the electrically conductive substrate 412 (e.g., shim) than the area available with a point contact such as a solder connection.

The reference electrical connector 810 is generally similar to the reference electrical connector 610 in that is has contact portion having a hoop shaped contact portion and an elongate lead portion 822 extending radially from the hoop shaped contact portion which connects to the reference source. Unlike the reference electrical connector 610 described above, the reference electrical connector 810 defines a gap 814 in the hoop shaped contact portion adjacent to the lead portion 822. The gap 814 provides an opening for the lead portion 422 of the signal electrical connector 508 to extend therethrough. This reduces the height (thickness) of the piezoelectric assembly 800, and reduces the stress on the piezoelectric assembly 800 when the piezoelectric material 406 expands and reducing the work required by the piezoelectric element 406 to actuate, thereby allowing an increased response and increased tactile feedback.

While the hoop-type reference electrical connectors 610 and 810 have been described in the context of use with the source electrical connectors of the present disclosure, it will be appreciated that the reference electrical connectors 610 or 810 could be used in a piezoelectric assembly in combination with a conventional solder connection which connects the first electrode 402 to the power source, depending on the embodiment.

Although the piezoelectric assemblies 400, 500, 600, 700 and 800 have been described separately, with certain variations, the variations described may be combined, and the piezoelectric assemblies 400, 500, 600, 700 and 800 may each have a combination of any of the variations described. For example, each of the piezoelectric assemblies 400, 500, 600, 700 and 800 may comprise the signal electrical connector 408 or 508, as described above. Similarly and in addition, each of the piezoelectric assemblies 400, 500, 600, 700 and 800 may comprise the reference electrical connector 410, 610 or 810, as described above. Although the signal electrical connector 408 is described as receiving a signal from a current or voltage source and communicating the signal to the first electrode 402, and the reference electrical connector 410 and second electrode 404 are described as being in electrical communication with a reference source, the signal and reference may be reversed such that the first electrode 402 is in electrical communication with the reference source and the second electrode 404 is in electrical communication with the current or voltage source to receive a signal.

In the above description, for purposes of explanation, numerous details are set forth in order to provide a thorough understanding of the present disclosure. However, it will be apparent to one skilled in the art that these specific details are not required in order to practice the present disclosure. In other instances, well-known electrical structures and circuits are shown in block diagram form in order not to obscure the present disclosure. Although certain dimensions and materials are described for implementing the disclosed example embodiments, other suitable dimensions and/or materials may be used within the scope of this disclosure. All such modifications and variations, including all suitable current and future changes in technology, are believed to be within the sphere and scope of the present disclosure. All references mentioned are hereby incorporated by reference in their entirety.

The invention claimed is:

1. A piezoelectric assembly, comprising:
a first electrode for electrical communication to a current or voltage source, the first electrode having a contact surface;
a second electrode for electrical communication to a reference source, the second electrode being spaced apart from the first electrode such that an electric field is generated between the first and second electrodes when an electrical signal is received at the first electrode from the current or voltage source;
a piezoelectric material in electrical communication with each one of the first and second electrodes and between the first and second electrodes, the piezoelectric material being disposed in the generated electric field when the first electrode receives the electrical signal, wherein the piezoelectric material has an unactuated state and an actuated state, wherein the piezoelectric material is disposed in the unactuated state in the absence of the generated electric field, and wherein the piezoelectric material becomes displaced and disposed in the actuated state in the presence of the generated electric field;
a signal electrical connector in electrical communication with the first electrode and configured to be connected to the current or voltage source so as to provide electrical communication between the first electrode and the current or voltage source, wherein the first electrode is disc-shaped and the signal electrical connector has a hoop shaped contact portion and a plurality of extensions extending radially inwardly from the hoop shaped contact portion; and
a reference electrical connector in electrical communication with the second electrode and configured to be connected to the reference source so as to provide electrical communication between the second electrode and the reference source.

2. The piezoelectric assembly of claim 1, wherein the signal electrical connector further comprises an elongate lead portion extending radially from the hoop shaped contact portion, the signal electrical connector having a neck portion where the hoop shaped contact portion of the signal electrical connector meets the elongate lead portion of the signal electrical connector near the peripheral edge surface of the piezoelectric material.

3. The piezoelectric assembly of claim 1, wherein the signal electrical connector is in contact engagement with at least a major portion of an isoline defined by a side surface of the first electrode and spaced inwardly from a peripheral edge of the first electrode.

4. The piezoelectric assembly of claim 3, wherein the isoline is defined on a side surface of the first electrode and spaced inwardly from a peripheral edge of the side surface on which the isoline is defined by a constant minimum distance of less than 2 millimeters and disposed about substantially the entire peripheral surface area of the first electrode.

5. The piezoelectric assembly of claim 1, wherein the signal electrical connector is in contact engagement with a surface area portion of a side surface of the first electrode, wherein the surface area portion is disposed inwardly adjacent to a peripheral edge of the side surface and defines at least 5% of the surface area of the side surface.

6. The piezoelectric assembly of claim 1, wherein the signal electrical connector is formed from a flexible material, the flexible material being more resistant to fatigue than the first electrode.

7. The piezoelectric assembly of claim 6, wherein the signal electrical connector is connected to the first electrode using a conductive adhesive.

8. The piezoelectric assembly of claim 1, wherein the second electrode is disc-shaped and the reference electrical connector has a hoop shaped contact portion.

9. The piezoelectric assembly of claim 8, wherein the reference electrical connector is disposed in contact engagement with a conductive contact surface of the second electrode, wherein the reference electrical connector is in contact engagement with at least 5% of the surface area of a side surface of the second electrode.

10. The piezoelectric assembly of claim 8, wherein the reference electrical connector is in contact engagement with at least a major portion of an isoline defined by a side surface of the second electrode and spaced inwardly from a peripheral edge of the second electrode.

11. The piezoelectric assembly of claim 8, wherein the reference electrical connector is formed from a flexible material, the flexible material being more resistant to fatigue than the second electrode.

12. The piezoelectric assembly of claim 11, wherein the reference electrical connector is connected to the second electrode using a conductive adhesive.

13. The piezoelectric assembly of claim 1, further comprising a substrate disposed to support the second electrode, the substrate being electrically conductive and in electrical communication with the reference electrical connector so as to provide electrical communication between the second electrode and the reference electrical connector.

14. The piezoelectric assembly of claim 13, wherein the substrate is connected to the second electrode using a conductive adhesive.

15. The piezoelectric assembly of claim 1, wherein the second electrode is disc-shaped and the reference electrical connector has a hoop shaped contact portion,
wherein the reference electrical connector further comprises an elongate lead portion extending radially from the hoop shaped contact portion,
wherein the signal electrical connector further comprises an elongate lead portion extending radially from the hoop shaped contact portion, wherein the reference electrical connector defines a gap in the hoop shaped contact portion adjacent to the elongate lead portion, wherein the gap provides an opening for the lead portion of the signal electrical connector to extend therethrough.

16. A piezoelectric assembly, comprising:

a first electrode for electrical communication to a current or voltage source;

a second electrode for electrical communication to a reference source, the second electrode being spaced apart from the first electrode such that an electric field is generated between the first and second electrodes when an electrical signal is received at the first electrode from the current or voltage source;

a piezoelectric material in electrical communication with each one of the first and second electrodes and between the first and second electrodes, the piezoelectric material being disposed in the generated electric field when the first electrode receives the electrical signal, wherein the piezoelectric material has an unactuated state and an actuated state, wherein the piezoelectric material is disposed in the unactuated state in the absence of the generated electric field, and wherein the piezoelectric material becomes displaced and disposed in the actuated state in the presence of the generated electric field;

a signal electrical connector in electrical communication with the first electrode and configured to be connected to the current or voltage source so as to provide electrical communication between the first electrode and the current or voltage source; and a reference electrical connector in electrical communication with the second electrode and configured to be connected to the reference source so as to provide electrical communication between the second electrode and the reference source, wherein the second electrode is disc-shaped and the reference electrical connector has a hoop shaped contact portion and a plurality of extensions extending radially inwardly from the hoop shaped contact portion.

17. A handheld electronic device, comprising:

a processor;

a touch-sensitive display connected to the microprocessor for accepting touch input;

a piezoelectric assembly connected to the touch-sensitive display for providing a tactile feedback in response to the touch input, the piezoelectric assembly being disposed adjacent to a surface of the touch-sensitive display opposing an interface surface, the piezoelectric assembly being in a first configuration away from the touch-sensitive display in an unactuated state and being disposed in a second configuration with the touch-sensitive display in an actuated state, the piezoelectric assembly being actuated in response to a signal representing an initial touch input and being unactuated in the absence of the signal representing the initial touch input;

the piezoelectric assembly, comprising: a first electrode for electrical communication to a current or voltage source, the first electrode having a contact surface;

a second electrode for electrical communication to a reference source, the second electrode being spaced apart from the first electrode such that an electric field is generated between the first and second electrodes when an electrical signal is received at the first electrode from the current or voltage source;

a piezoelectric material in electrical communication with each one of the first and second electrodes and between the first and second electrodes, the piezoelectric material being disposed in the generated electric field when the first electrode receives the electrical signal, wherein the piezoelectric material has an unactuated state and an actuated state, wherein the piezoelectric material is disposed in the unactuated state in the absence of the generated electric field, and wherein the piezoelectric material becomes displaced and disposed in the actuated state in the presence of the generated electric field;

a signal electrical connector in electrical communication with the first electrode and configured to be connected to the current or voltage source so as to provide electrical communication between the first electrode and the current or voltage source, wherein the first electrode is disc-shaped and the signal electrical connector has a hoop shaped contact portion and a plurality of extensions extending radially inwardly from the hoop shaped contact portion; and a reference electrical connector in electrical communication with the second electrode and configured to be connected to the reference source so as to provide electrical communication between the second electrode and the reference source.

18. The handheld electronic device of claim 17, wherein the piezoelectric assembly being in a concave configuration away from the touch-sensitive display in an unactuated state and being disposed in a substantially planar configuration flush with the touch-sensitive display in an actuated state, the piezoelectric assembly being actuated in response to a signal representing an initial touch input and being unactuated in the absence of the signal representing the initial touch input.

19. The piezoelectric assembly of claim 7, wherein the signal electrical connector is a flexible printed circuit board (PCB) and is connected to the first electrode using a conductive pressure sensitive adhesive.

20. The piezoelectric assembly of claim 12, wherein the reference electrical connector is a flexible printed circuit board (PCB) and is connected to the second electrode using a conductive pressure sensitive adhesive.

21. The piezoelectric assembly of claim 12, wherein the substrate is connected to the second electrode using a graphite acrylic adhesive.

\* \* \* \* \*